(12) United States Patent
Luo

(10) Patent No.: US 11,058,023 B2
(45) Date of Patent: Jul. 6, 2021

(54) PCIE STRUCTURE CAPABLE OF TOOL-FREE DISASSEMBLY/ASSEMBLY

(71) Applicant: ZHENGZHOU YUNHAI INFORMATION TECHNOLOGY CO., LTD., Henan (CN)

(72) Inventor: Siheng Luo, Henan (CN)

(73) Assignee: ZHENGZHOU YUNHAI INFORMATION TECHNOLOGY CO., LTD., Henan (CN)

( * ) Notice: Subject to any disclaimer, the term of this patent is extended or adjusted under 35 U.S.C. 154(b) by 57 days.

(21) Appl. No.: 16/493,253

(22) PCT Filed: Sep. 29, 2018

(86) PCT No.: PCT/CN2018/108559
§ 371 (c)(1),
(2) Date: Sep. 11, 2019

(87) PCT Pub. No.: WO2019/062888
PCT Pub. Date: Apr. 4, 2019

(65) Prior Publication Data
US 2020/0120828 A1    Apr. 16, 2020

(30) Foreign Application Priority Data
Sep. 30, 2017  (CN) .......................... 201710918507.9

(51) Int. Cl.
*H05K 5/00* (2006.01)
*H05K 7/14* (2006.01)
(Continued)

(52) U.S. Cl.
CPC .......... *H05K 7/1489* (2013.01); *G06F 1/185* (2013.01); *G06F 13/4282* (2013.01); *G06F 2213/0026* (2013.01)

(58) Field of Classification Search
USPC ....................................................... 361/759
See application file for complete search history.

(56) References Cited

U.S. PATENT DOCUMENTS

| 6,297,957 B1 * | 10/2001 | Johnson .................. G06F 1/182 |
|---|---|---|
| | | 361/679.46 |
| 7,525,815 B2 * | 4/2009 | Chen ....................... G06F 1/185 |
| | | 361/755 |

(Continued)

FOREIGN PATENT DOCUMENTS

| CN | 102955530 A | 3/2013 |
|---|---|---|
| CN | 203299731 U | 11/2013 |

(Continued)

OTHER PUBLICATIONS

International Search Report for PCT/CN2018/108559 dated Dec. 29, 2018, ISA/CN.

*Primary Examiner* — Hung S. Bui
(74) *Attorney, Agent, or Firm* — Yue (Robert) Xu; Apex Attorneys at Law, LLP

(57) ABSTRACT

The present invention relates to the field of servers, and disclosed thereby is a peripheral component interconnect express (PCIE) structure capable of tool-free disassembly/assembly, including: a node base and a PCIE support, a board card being mounted on the node base, and the board card being provided thereon with a PCIE insertion slot; a Riser card is mounted on the PCIE support, and a PCIE card is mounted within the PCIE slot by means of the Riser card; the PCIE support is detachably mounted on the node base, and the node base on which the PCIE support is mounted may be steadily placed into a machine case. The PCIE structure provided by the present invention may simultaneously lock two adjacent PCIE supports within a node, and no tools are required for the entire assembly and disassembly process.

4 Claims, 10 Drawing Sheets

(51) Int. Cl.
*G06F 1/18* (2006.01)
*G06F 13/42* (2006.01)

(56) References Cited

U.S. PATENT DOCUMENTS

| | | | |
|---|---|---|---|
| 2013/0050965 A1 | 2/2013 | Zhou | |
| 2013/0301209 A1* | 11/2013 | Zhou | ........................ G06F 1/186 361/679.32 |
| 2017/0135256 A1 | 5/2017 | Chen et al. | |

FOREIGN PATENT DOCUMENTS

| | | |
|---|---|---|
| CN | 204740550 U | 11/2015 |
| CN | 106681446 A | 5/2017 |
| CN | 107765787 A | 3/2018 |
| DE | 102011103094 A1 | 12/2012 |

* cited by examiner

PCIE STRUCTURE CAPABLE OF TOOL-FREE DISASSEMBLY/ASSEMBLY

The application is the national phase of International Application No. PCT/CN2018/108559, titled "PCIE STRUCTURE CAPABLE OF TOOL-FREE DISASSEMBLY/ASSEMBLY", filed on Sep. 29, 2018, which claims the priority to Chinese Patent Application No. 201710918507.9 titled "PCIE STRUCTURE CAPABLE OF TOOL-FREE DISASSEMBLY/ASSEMBLY", filed with the China National Intellectual Property Administration on Sep. 30, 2017, the entire disclosures thereof are incorporated herein by reference.

FIELD

A peripheral component interconnect express (PCIE) structure capable of tool-free disassembly and assembly is provided according to the present application, the present application relates to the field of servers, and in particular to a PCIE structure of a server.

BACKGROUND

Peripheral component interconnect express (PCIE) cards are widely used in servers. Screws are generally required during the assembly and disassembly of PCIE brackets, and the operation is complicated.

SUMMARY

In order to solve the above problem, a peripheral component interconnect express (PCIE) structure capable of tool-free disassembly and assembly is provided according to the present application, which can lock multiple PCIE brackets, and no tool is required during the whole assembly and disassembly processes, which greatly simplifies the steps of PCIE disassembly and assembly, and thereby improving the efficiency.

The technical solution of the present application is as follows. A PCIE structure capable of tool-free disassembly and assembly includes a node base and a PCIE bracket, a board card is mounted at the node base, the board card is provided with a PCIE insertion slot, a riser card is mounted at the PCIE bracket, a PCIE card is mounted in the PCIE insertion slot through the riser card, the PCIE bracket is detachably mounted on the node base, and the node base equipped with the PCIE bracket can be smoothly placed into a machine case.

The technical solution of the present application further includes: the number of the PCIE bracket is at least two, and the adjacent PCIE brackets are fixed to the node base by a buckle.

Figure 1:
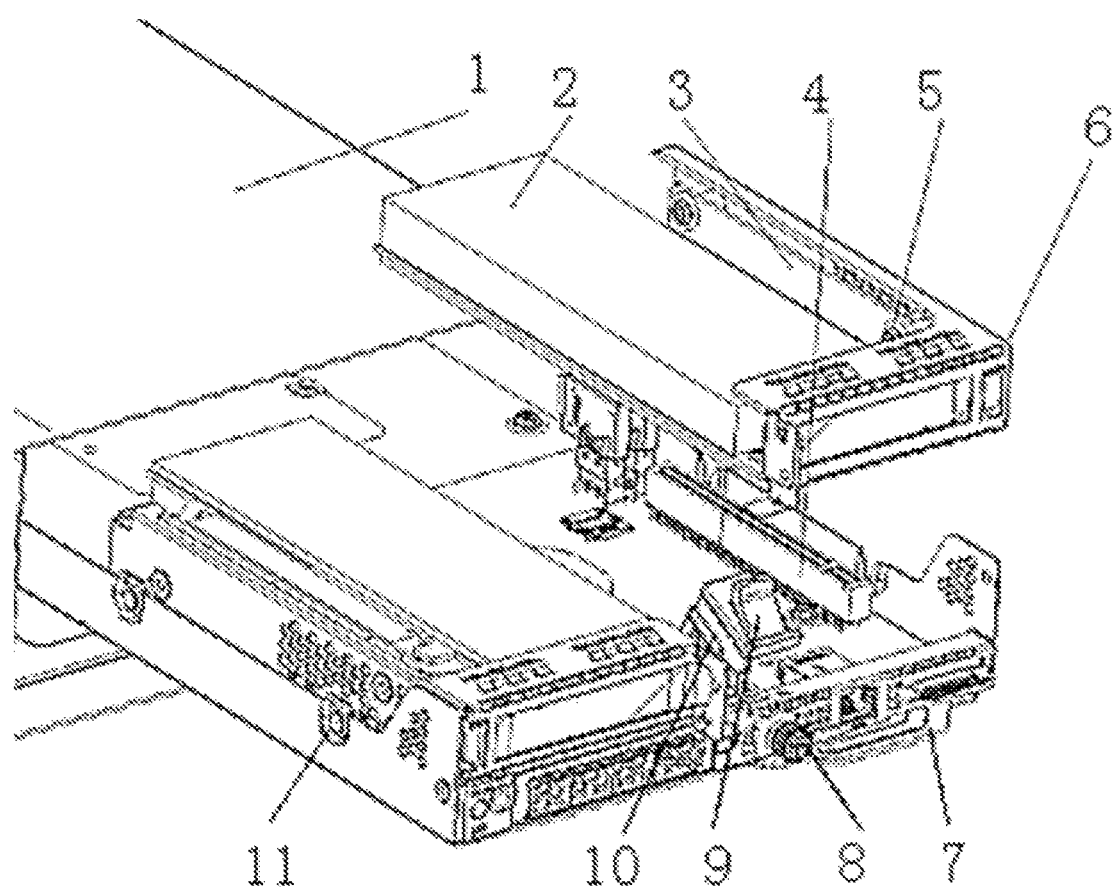
FIG. 1 is a schematic view showing an overall structure according to the present application.
Figure 2:
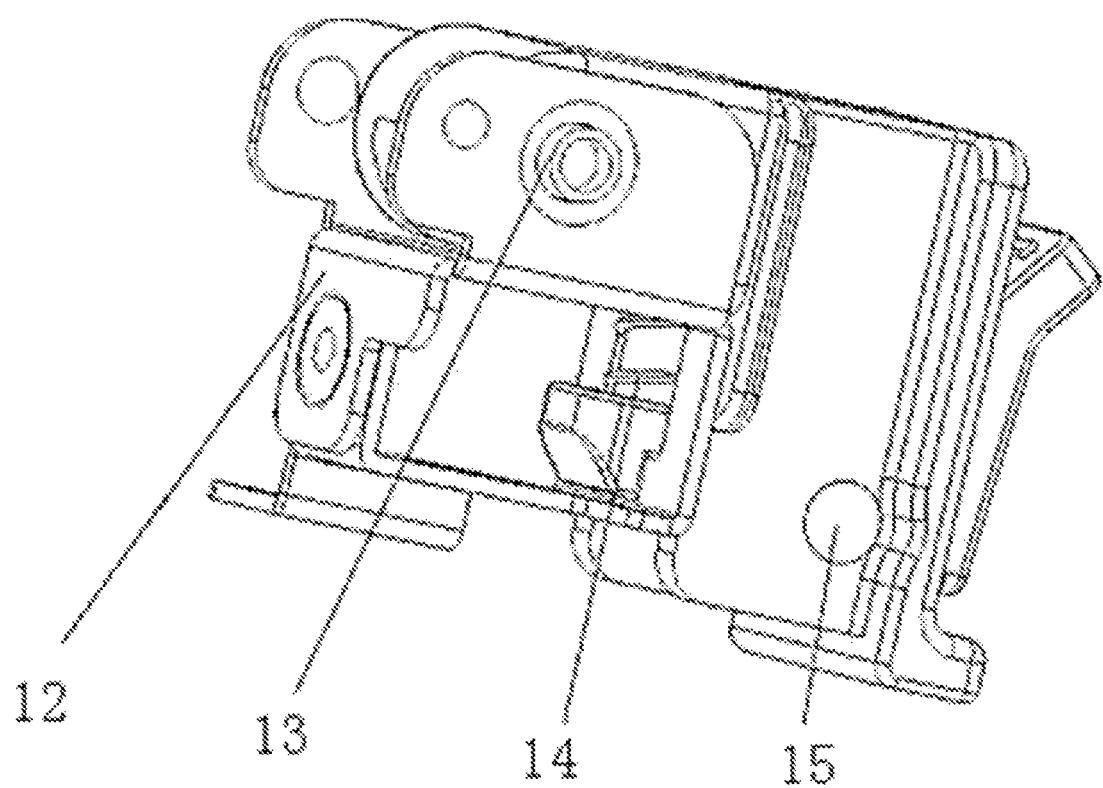
FIG. 2 is a schematic view showing the structure of a buckle according to the present application.
Figure 3:
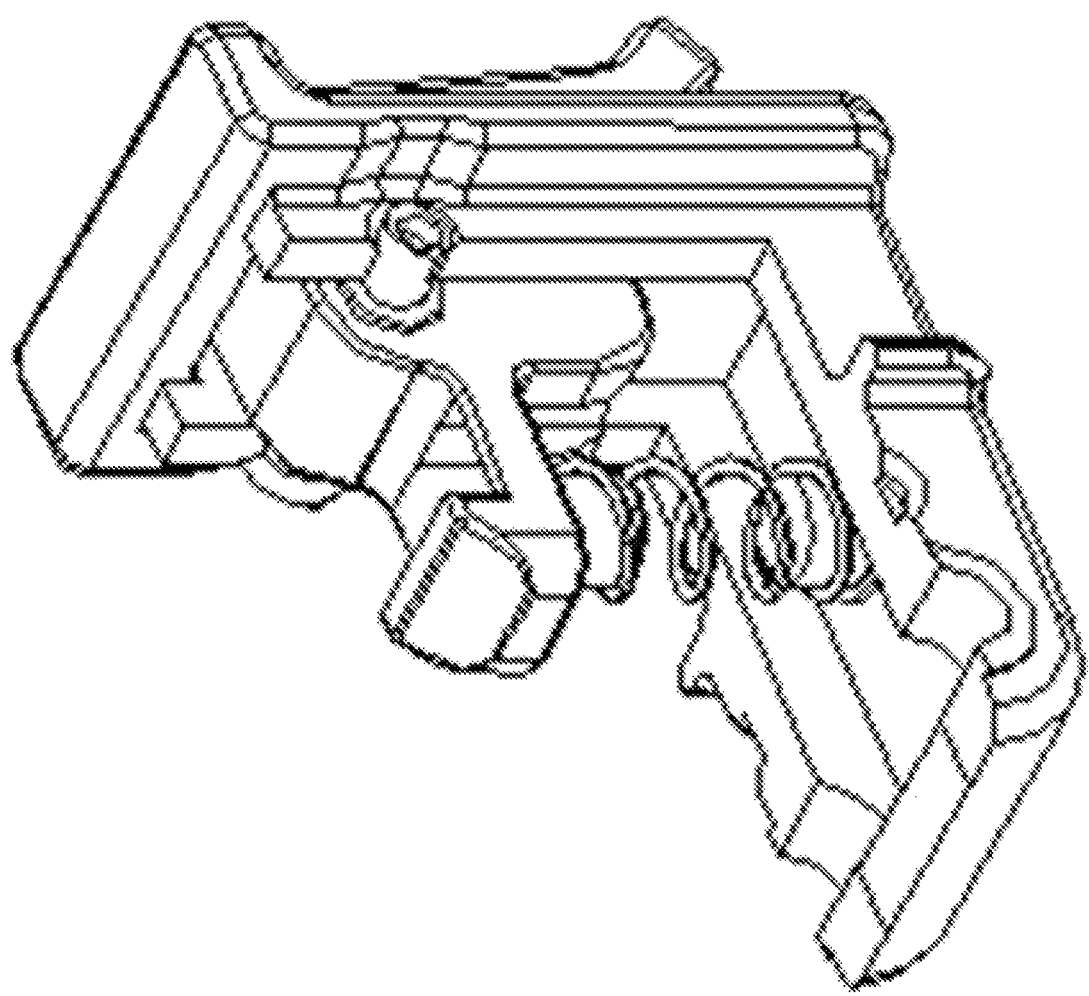
FIG. 3 is a schematic view showing the structure of a buckle according to the present application.
Figure 4:
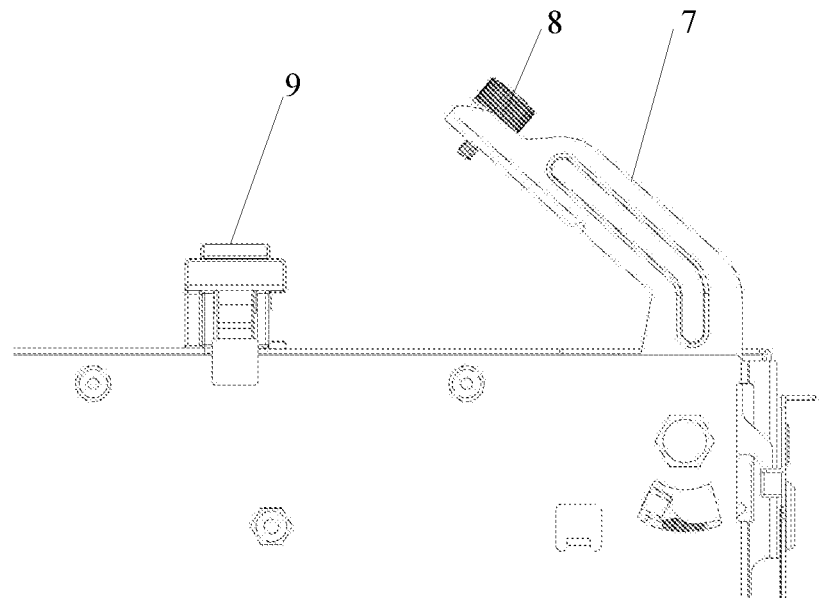
FIG. 4 is a structural schematic view showing that one end of a handle is separated from a node base according to the present application.
Figure 5:
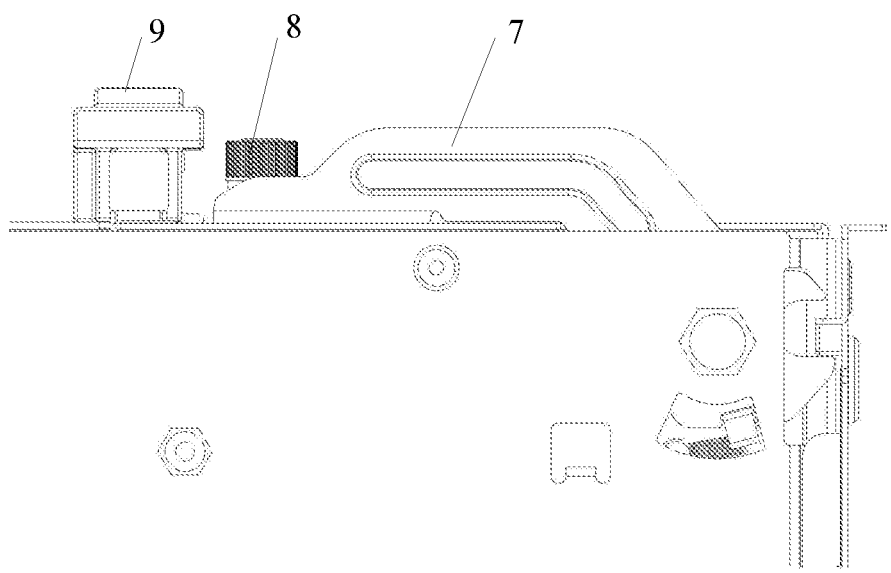
FIG. 5 is a structural schematic view showing that the end of the handle is connected to the node base according to the present application.
Figure 6:
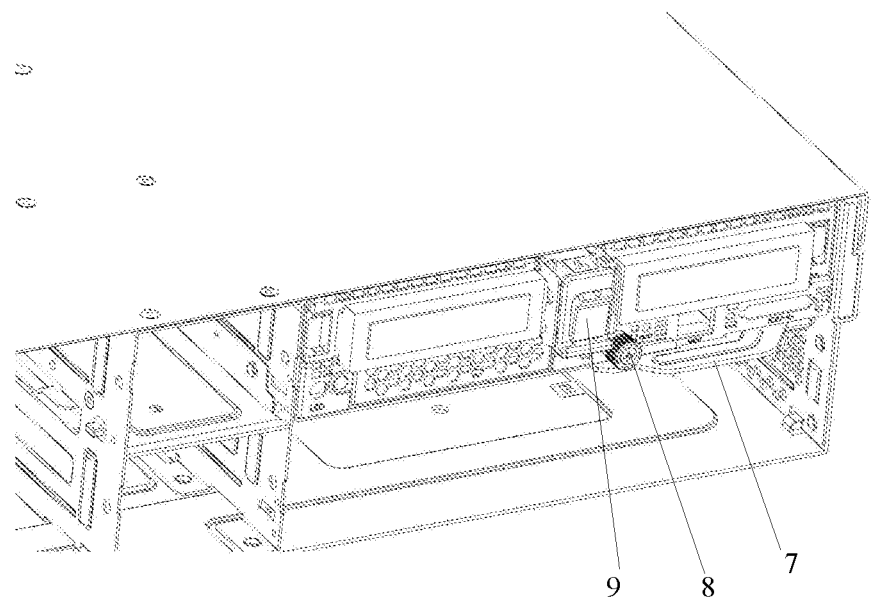
FIG. 6 is a schematic view of a first step of quickly disassembling a PCIE structure according to the present application.
Figure 7:
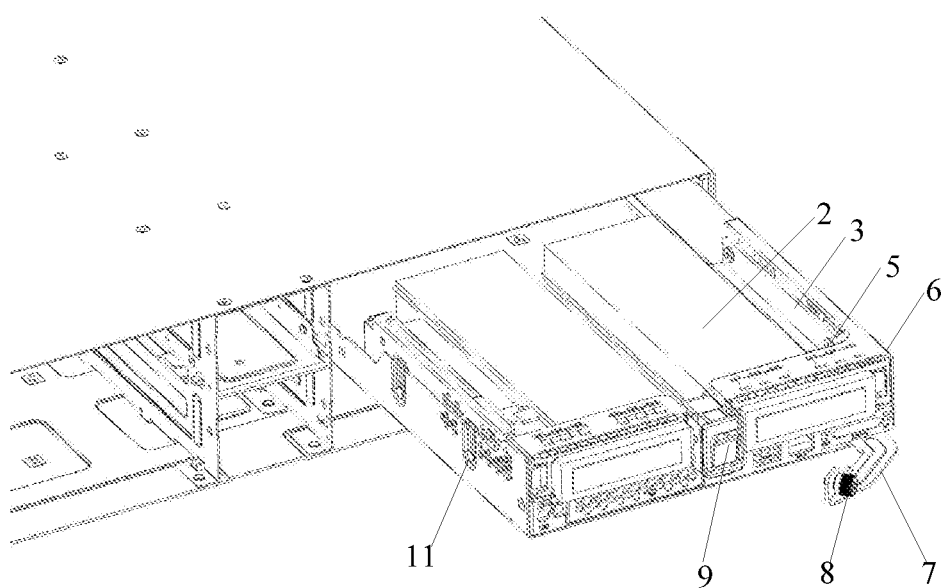
FIG. 7 is a schematic view of a second step of quickly disassembling the PCIE structure according to the present application.
Figure 8:
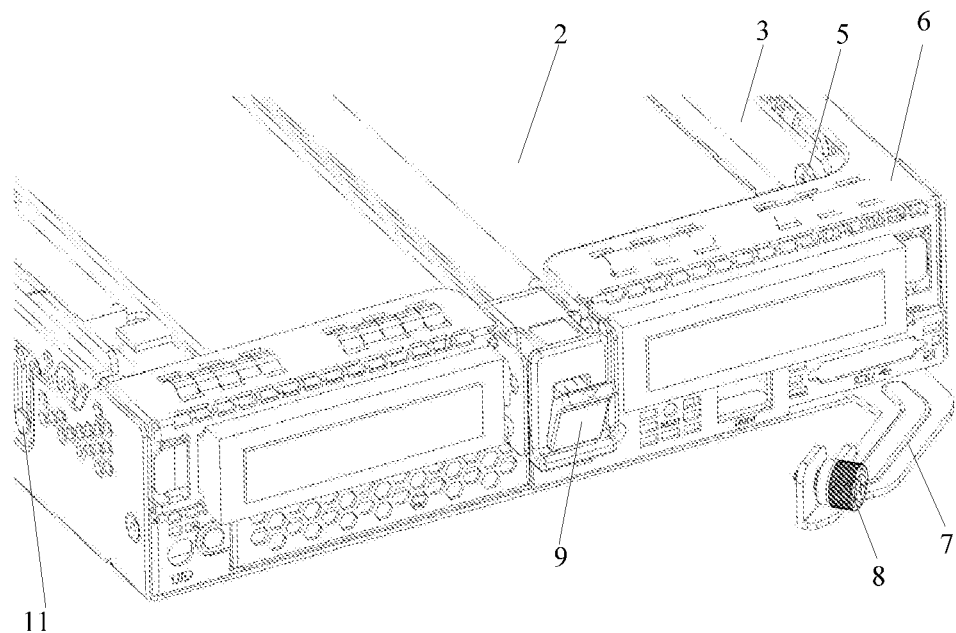
FIG. 8 is a schematic view of a third step of quickly disassembling the PCIE structure according to the present application.
Figure 9:
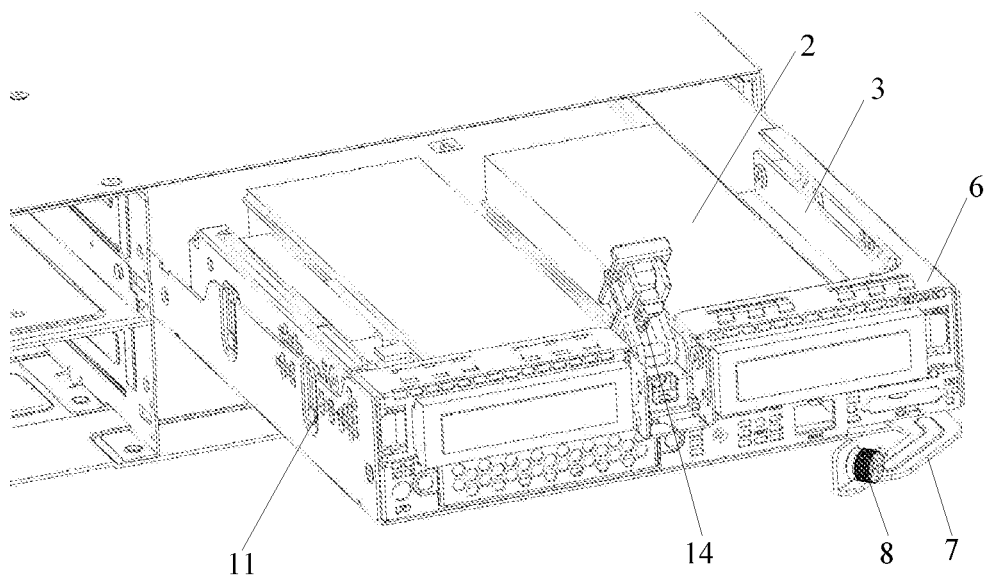
FIG. 9 is a schematic view of a fourth step of quickly disassembling a PCIE structure according to the present application.
Figure 10:
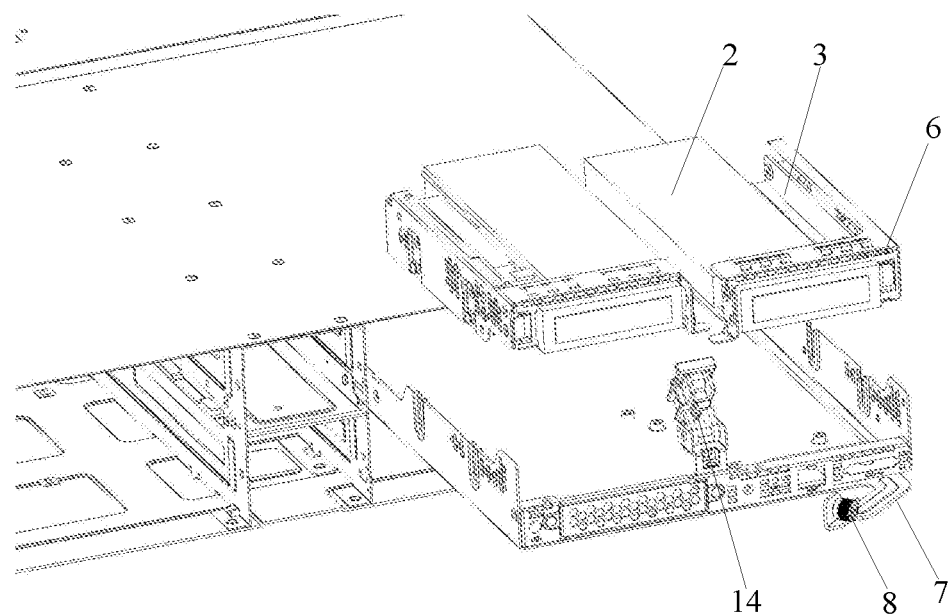
FIG. 10 is a schematic view of a fifth step of quickly disassembling the PCIE structure according to the present application.
Figure 11:
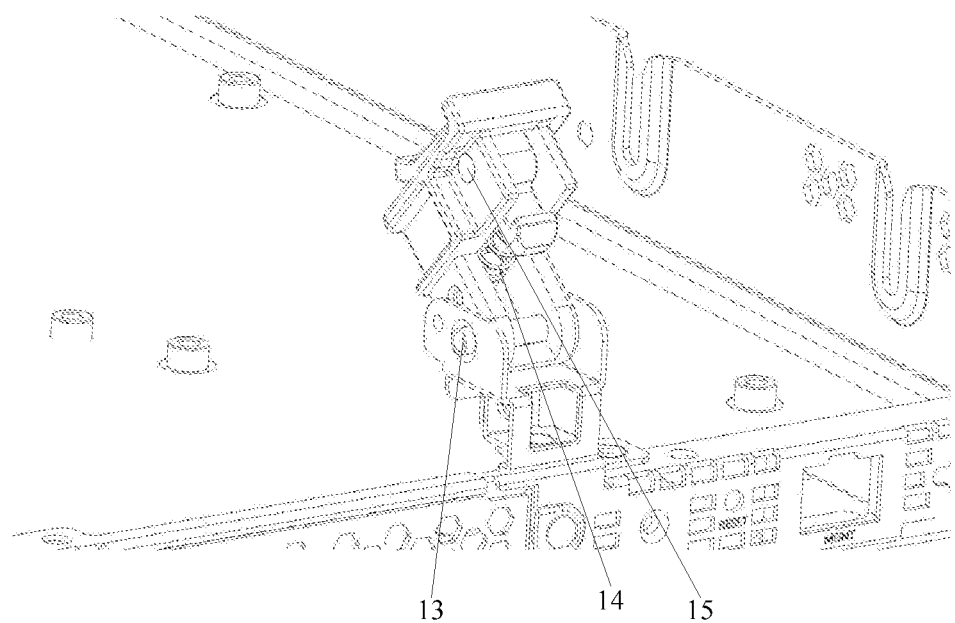
FIG. 11 is a partially enlarged view of the fifth step of quickly disassembling the PCIE structure according to the present application.
Figure 12:
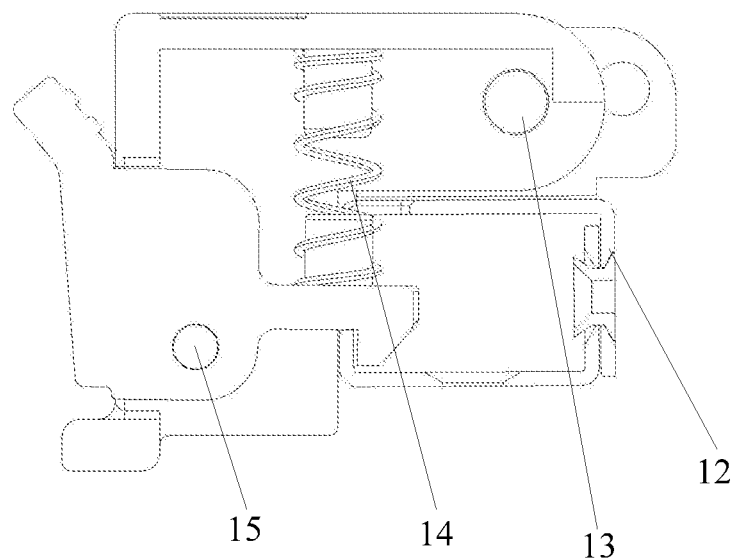
FIG. 12 is a schematic view showing a quick disassembly device according to the present application in a first state.
Figure 13:
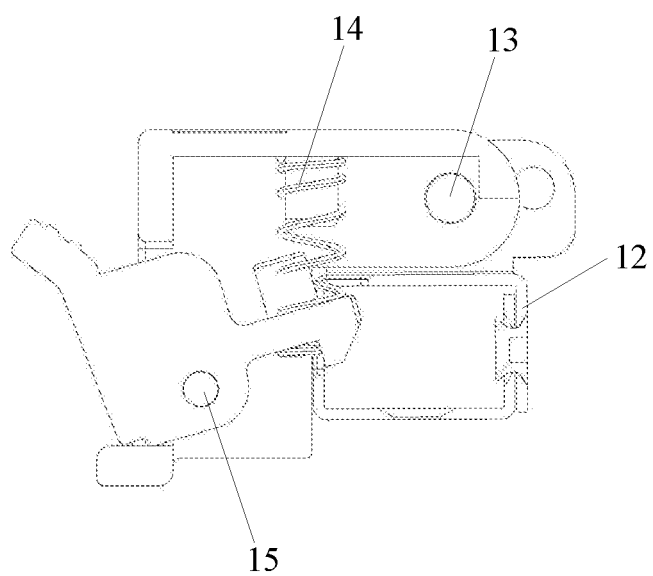
FIG. 13 is a schematic view showing the quick disassembly device according to the present application in a second state.
Figure 14:
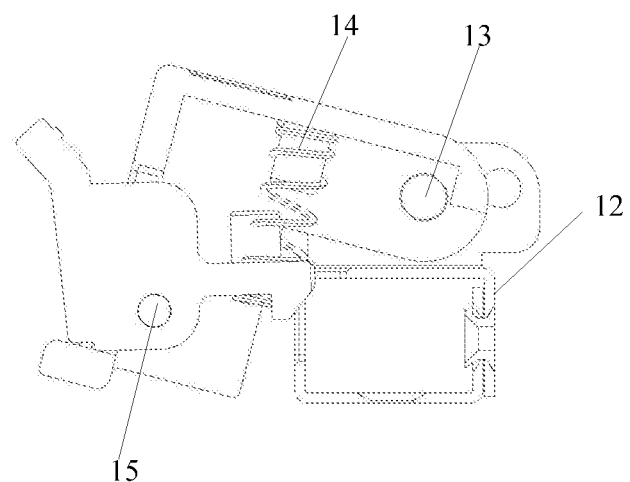
FIG. 14 is a schematic view showing the quick disassembly device according to the present application in a third state.
Figure 15:
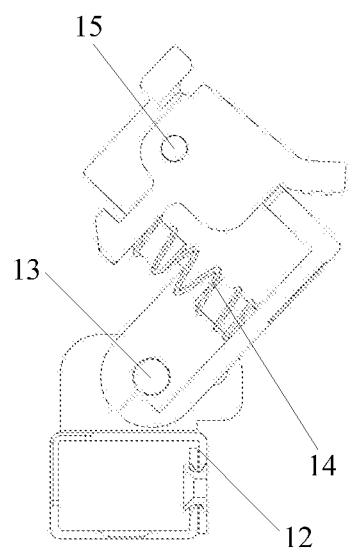
FIG. 15 is a schematic view showing the quick disassembly device according to the present application in a fourth state.
Figure 16:
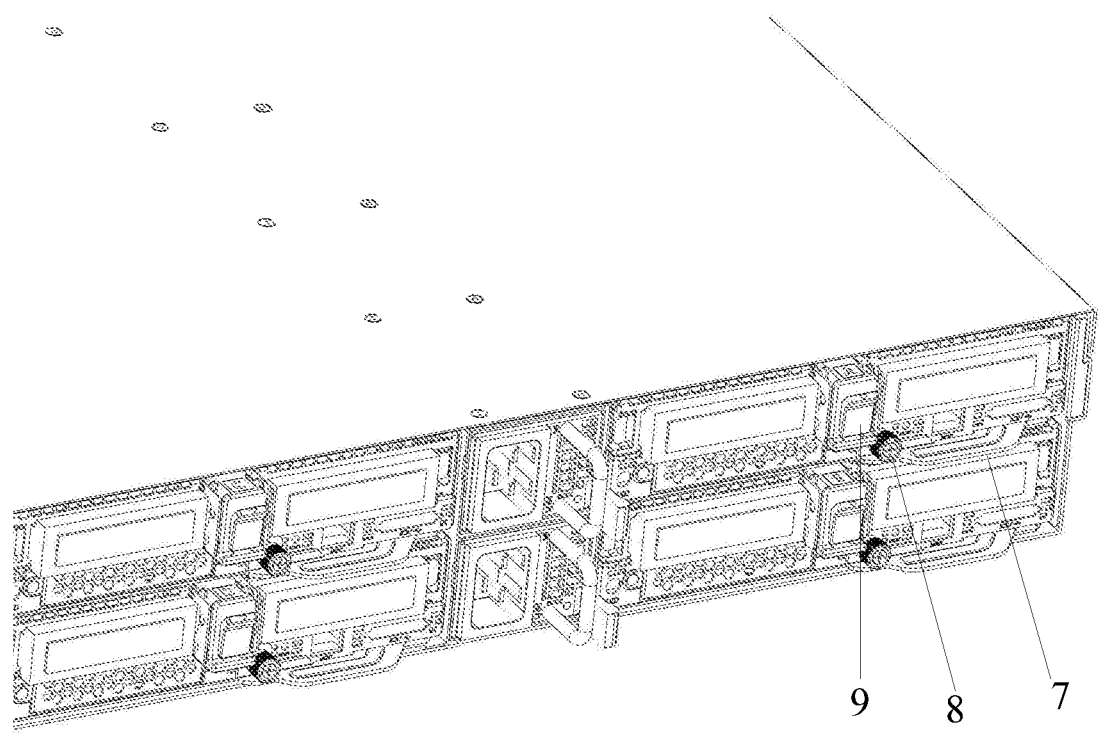
FIG. 16 is a schematic view showing the overall structure according to the present application.

Reference Numerals:

| | | | |
|---|---|---|---|
| 1 | upper cover of machine case, | 2 | PCIE card, |
| 3 | riser card, | 4 | PCIE insertion slot, |
| 5 | screw, | 6 | PCIE bracket, |
| 7 | handle, | 8 | manually-operated screw, |
| 9 | buckle knob, | 10 | buckle, |
| 11 | push pin, | 12 | buckle seat, |
| 13 | pin, | 14 | spring, |
| 15 | pin. | | |

DETAILED DESCRIPTION

The present application will be further described hereinafter in conjunction with drawings and embodiments.

Besides, since only some of embodiments are described hereinafter, the embodiments in the present application and the features in the embodiments may be combined with each other in a case that no conflict occurs.

A peripheral component interconnect express (PCIE) structure capable of tool-free disassembly and assembly includes a node base and a PCIE bracket 6, a board card is mounted at the node base, the board card is provided with a PCIE insertion slot 4, a riser card 3 is mounted at the PCIE bracket 6, the PCIE insertion slot 4 is configured for mounting a PCIE card 2 via the riser card 3, the PCIE bracket 6 is detachably mounted on the node base, and the node base equipped with the PCIE bracket 6 can be smoothly placed into the machine case.

As shown in FIG. 1, the PCIE card 2 is inserted into the PCIE insertion slot of the riser card 3, and the riser card 3 can be vertically inserted in the PCIE insertion slot 4 in the node base.

First Embodiment: a number of the PCIE bracket 6 is at least two, and adjacent PCIE brackets 6 are fixed to the node base by a buckle 10.

The buckle 10 is mounted at the node base through a buckle seat 12.

Each of two sides of the buckle 10 close to the PCIE brackets 6 is provided with a contractible protrusion.

The buckle seat is provided with a buckle knob 9 and a spring 14, one end of the spring 14 is connected to the contractible protrusions, and another end of the spring 14 is connected to the buckle knob 9.

When the PCIE bracket 6 is mounted in position, the buckle 10 is in a locked state, and the protrusions at the two sides of the buckle can fix the PCIE bracket 6. After a node is pushed into the machine case, an upper cover 1 of the machine case can press an upper end of the PCIE bracket 6, in this way, the PCIE bracket 6 is completely restrained. In a case that the PCIE card 2 is required to be removed, a manually-operated screw 8 is loosened, a handle 7 is rotated to an unlocked position, the node base is pulled out, the buckle 10 can be loosened after the buckle knob 9 is rotated, and the PCIE bracket 6 can be pulled out upwardly.

Second Embodiment: The handle 7 is mounted at a bottom portion of a front end of the node base. One end of the handle 7 is mounted at the node base through a manually-operated fastener, and another end of the handle 7 is free.

Preferably, a manually-operated screw 8 is pressed on the handle, and when the manually-operated screw 8 is loosened, the handle is able to rotate within a certain angle range.

Third Embodiment: a push pin is arranged at a side of each of the PCIE brackets 6 and an U-shaped hole corresponding to the push pin 11 is provide in the node base.

The push pin 11 is pressed on the PCIE bracket 6 by press-riveting. The U-shaped hole corresponding to the push pin 11 is provided in the node base. When the PCIE bracket 6 is lowered to a lowest position, the push pin 11 cooperates with the hole just right, to support the PCIE bracket 6.

The embodiments described hereinabove are only preferred embodiments of the present application, and are not intended to limit the scope of the present application in any form. Any modifications, equivalent substitutions and improvements made within the spirit and principles of the present application are deemed to fall into the scope of the technical solution of the present application.

The invention claimed is:

1. A peripheral component interconnect express, PCIE, structure capable of tool-free disassembly and assembly, comprising a node base and at least two PCIE brackets, wherein a board card is mounted at the node base, the board card is provided with a PCIE insertion slot, a riser card is mounted at each of the PCIE brackets, the PCIE insertion slot is configured for mounting a PCIE card via the riser card, the PCIE brackets are detachably mounted on the node base, the adjacent PCIE brackets are fixed to the node base by a fixing device, and the node base equipped with the PCIE brackets is allowed to be smoothly placed into a machine case; wherein the fixing device is a buckle, and the buckle is mounted at the node base through a buckle seat;

each of two sides of the buckle close to the PCIE brackets is provided with a contractible protrusion; and the buckle seat is provided with a buckle knob and a spring, one end of the spring is connected to the contractible protrusion, and another end of the spring is connected to the buckle knob.

2. The PCIE structure capable of tool-free disassembly and assembly according to claim 1, wherein a handle is mounted at a bottom portion of a front end of the node base.

3. The PCIE structure capable of tool-free disassembly and assembly according to claim 2, wherein one end of the handle is mounted at the node base through a manually-operated fastener, and another end of the handle is free.

4. The PCIE structure capable of tool-free disassembly and assembly according to claim 1, wherein a push pin is arranged at a side of each of the PCIE brackets, and an U-shaped hole corresponding to the push pin is provide in the node base.

* * * * *